United States Patent
Ida et al.

(10) Patent No.: US 9,528,079 B2
(45) Date of Patent: Dec. 27, 2016

(54) SUBSTRATE CLEANING LIQUID AND SUBSTRATE CLEANING METHOD

(71) Applicant: Kurita Water Industries Ltd., Tokyo (JP)

(72) Inventors: Junichi Ida, Tokyo (JP); Tatsuo Nagai, Tokyo (JP)

(73) Assignee: Kurita Water Industries Ltd. (JP)

(*) Notice: Subject to any disclaimer, the term of this patent is extended or adjusted under 35 U.S.C. 154(b) by 0 days.

(21) Appl. No.: 14/651,355

(22) PCT Filed: Oct. 9, 2013

(86) PCT No.: PCT/JP2013/077468
§ 371 (c)(1),
(2) Date: Jun. 11, 2015

(87) PCT Pub. No.: WO2014/091817
PCT Pub. Date: Jun. 19, 2014

(65) Prior Publication Data
US 2015/0307819 A1    Oct. 29, 2015

(30) Foreign Application Priority Data
Dec. 13, 2012  (JP) .................................. 2012-272843

(51) Int. Cl.
*H01L 21/02* (2006.01)
*C11D 11/00* (2006.01)
(Continued)

(52) U.S. Cl.
CPC ............. *C11D 11/0047* (2013.01); *C11D 7/08* (2013.01); *H01L 21/31111* (2013.01)

(58) Field of Classification Search
CPC ..... C11D 11/0047; C11D 3/3947; C11D 7/08; H01L 21/02057
See application file for complete search history.

(56) References Cited

U.S. PATENT DOCUMENTS

2005/0156140 A1* 7/2005 Shimizu ................ C09K 13/08
                                                              252/79.3
2008/0064223 A1   3/2008 Eguchi et al.
(Continued)

FOREIGN PATENT DOCUMENTS

CN         1914710 A      2/2007
CN       102437050 A      5/2012
(Continued)

OTHER PUBLICATIONS

International Search Report issued in corresponding International Application No. PCT/JP2013/077468 dated Dec. 24, 2013.

*Primary Examiner* — Gregory Webb
(74) *Attorney, Agent, or Firm* — Bakerhostetler LLP (57) ABSTRACT

In order to selectively further etch silicon nitride by a cleaning liquid in cleaning of a substrate having silicon nitride and silicon oxide on the substrate, a cleaning liquid for use in cleaning of a substrate having silicon nitride and silicon oxide on the same substrate, at least a portion of one or both of the silicon nitride and the silicon oxide being exposed on the substrate, including phosphoric acid, electrolytic sulfuric acid produced by electrolysis and including persulfuric acid suitably having a concentration of 1.0 g/L to 8.0 g/L, and water is suitably brought into contact with the substrate at 165° C. or higher and lower than a boiling point to selectively etch the silicon nitride on the substrate, thereby effectively etching the silicon nitride while etching of silicon oxide is suppressed to favorably clean a semiconductor substrate high in degree of integration having a pattern line width of 37 nm or less.

10 Claims, 6 Drawing Sheets

(51) Int. Cl.
*H01L 21/311* (2006.01)
*C11D 7/08* (2006.01)

(56) References Cited

U.S. PATENT DOCUMENTS

| | | | |
|---|---|---|---|
| 2010/0051066 A1* | 3/2010 | Kuwabara | C11D 3/3947 134/41 |
| 2010/0190413 A1* | 7/2010 | Nishimoto | B24B 37/0056 451/28 |
| 2012/0074102 A1 | 3/2012 | Magara et al. | |

FOREIGN PATENT DOCUMENTS

| | | |
|---|---|---|
| JP | 2000-58500 A | 2/2000 |
| JP | 2002-246378 A | 8/2002 |
| JP | 2008-071801 A | 3/2008 |
| JP | 2012-074601 A | 4/2012 |
| JP | 2012-169562 A | 9/2012 |
| JP | 2012-204424 A | 10/2012 |
| KR | 10-2008-0024080 A | 3/2008 |
| KR | 10-2012-0033250 A | 4/2012 |
| TW | 200814181 A | 3/2008 |
| TW | 200914591 A | 4/2009 |
| TW | 201220512 A | 5/2012 |

\* cited by examiner

SUBSTRATE CLEANING LIQUID AND SUBSTRATE CLEANING METHOD

CROSS-REFERENCE TO RELATED APPLICATIONS

The present application is a U.S. National Phase of International Patent Application No. PCT/JP2013/077468, filed on Oct. 9, 2013, which claims priority to Japanese Patent Application No. 2012-272843 filed on Dec. 13, 2012, which are incorporated herein by reference in their entireties.

TECHNICAL FIELD

The present invention relates to manufacturing of electronic components, and relates to a substrate cleaning liquid and a substrate cleaning method that, while etching of silicon oxide on a substrate having silicon oxide and silicon nitride is suppressed, etches silicon nitride.

BACKGROUND ART

In a semiconductor manufacturing process, silicon nitride is utilized for a hard mask in forming of a silicon oxide film, a side wall for protecting a fine pattern, a stopper of CMP polishing, and the like. Moreover, in accordance with an increase in degree of semiconductor integration, miniaturizing of a structure and thinning of a film structure have advanced, and therefore the film thickness of a silicon oxide film has also been increasingly thinner. In order to etch silicon nitride for patterning, etching is conducted, and a phosphoric acid solution at about 160° C. has conventionally been used for such etching of a silicon nitride film (for example, Patent Literature 1). The phosphoric acid solution at about 160° C., however, not only removes a silicon nitride film, but also partially removes a silicon oxide film due to etching by the phosphoric acid solution.

In order to enhance productivity for preforming high precision patterning, it is necessary to promote etching of silicon nitride while selectively suppressing etching of silicon oxide, and an improved method has been conventionally proposed in which SiN is selectively etched while etching of $SiO_2$ is suppressed in cleaning of a substrate on which $SiO_2$ and SiN are exposed, thereby resulting in an increase in selection ratio that means the ratio of the etching rate of $SiO_2$ to the etching rate of SiN (see, for example, Patent Literatures 2 and 3).

In Patent Literature 2, an etching solution containing sulfuric acid and fluoride as main components and containing water in an amount of 5% by mass or less has been proposed. Moreover, in Patent Literature 3, an etching liquid containing phosphoric acid, sulfuric acid, and an oxidant including no metal element has been proposed, and the oxidant has been, for example, ammonium peroxodisulfate.

CITATION LIST

Patent Literature

Patent Literature 1: Japanese Patent Laid-Open No. 2000-58500
Patent Literature 2: Japanese Patent Laid-Open No. 2002-246378
Patent Literature 3: Japanese Patent Laid-Open No. 2008-71801

SUMMARY OF INVENTION

Technical Problem

In accordance with a narrower line width of a semiconductor substrate, however, even fine etching is supposed to have a large impact to form a structure having a thinner thickness of a $SiO_2$ film and a narrower line width than a conventional one. In view of such a circumstance, SiN etching that has high selectivity while the cleaning effect on SiN is sufficiently ensured is increasingly demanded.

The present invention has been made in view of the above circumstance, and an object thereof is to provide a substrate cleaning liquid and a substrate cleaning method that impart a good etching rate of silicon nitride and that also impart a high selection ratio while etching of silicon oxide is suppressed.

Solution to Problem

That is, with respect to the substrate cleaning liquid of the present invention, a first aspect of the present invention provides a cleaning liquid for use in cleaning of a substrate having silicon nitride and silicon oxide on the same substrate, at least a portion of one or both of the silicon nitride and the silicon oxide being exposed on the substrate, wherein the cleaning liquid includes phosphoric acid, electrolytic sulfuric acid including persulfuric acid produced by electrolysis of sulfuric acid, and water, and is warmed to 165° C. or higher and lower than a boiling point for use in the cleaning.

A second aspect of the present invention provides a substrate cleaning method according to the first aspect, wherein a concentration of the persulfuric acid produced by electrolysis in an entire cleaning liquid is 1.0 to 8.0 g/L.

A third aspect of the present invention provides the substrate cleaning liquid according to any of the first and second aspects, wherein a concentration of the phosphoric acid is 15 to 40% by mass and a concentration of the sulfuric acid is 30 to 85% by mass in the entire cleaning liquid.

A fourth aspect of the present invention provides the substrate cleaning liquid according to any of the first to third aspects, wherein a ratio of a concentration (% by mass) of the phosphoric acid to a concentration (% by mass) of the sulfuric acid ranges from 1:1.5 to 1:4 in the entire cleaning liquid.

A fifth aspect of the present invention provides the substrate cleaning liquid according to any of the first to fourth aspects, having a water content of 15 to 25% by mass.

A sixth aspect of the present invention provides the substrate cleaning liquid according to any of the first to fifth aspects, for use in sheet-type cleaning of the substrate.

A seventh aspect of the present invention provides a substrate cleaning method that is a method for cleaning a substrate having silicon nitride and silicon oxide on the same substrate, at least a portion of one or both of the silicon nitride and the silicon oxide being exposed on the substrate, the method including bringing the substrate into contact with the substrate cleaning liquid according to the first to sixth aspects of the present invention to selectively etch the silicon nitride on the substrate.

An eighth aspect of the present invention provides the substrate cleaning method according to the seventh aspect, wherein the silicon nitride is stacked on the silicon oxide on the substrate.

A ninth aspect of the present invention provides the substrate cleaning method according to the seventh or eighth aspect, wherein the substrate has a pattern line width of 32 nm or less.

A tenth aspect of the present invention provides the substrate cleaning method according to any of the seventh to ninth aspects, including cleaning the substrate by the cleaning liquid in a sheet-type manner.

An eleventh aspect of the present invention provides the substrate cleaning method according to any of the seventh to tenth aspects, including recovering a cleaning liquid used for cleaning, subjecting the cleaning liquid to electrolysis to increase a concentration of persulfuric acid, and thereafter further subjecting the resulting cleaning liquid to the cleaning as a cleaning liquid.

Hereinafter, configurations defined in the present invention are described.

In the present invention, persulfuric acid produced by electrolyzing sulfuric acid is included, and a persulfuric acid salt is not included.

In the present invention, etchability of silicon nitride by phosphoric acid is favorably achieved. Phosphoric acid, however, has a function of etching silicon oxide, and therefore etching of silicon oxide by phosphoric acid is suppressed by sulfuric acid and persulfuric acid. Such functions enable silicon nitride to be selectively etched for performing effective cleaning.

Hereinafter, respective conditions and the like are described in more detail.

Concentration of Persulfuric Acid: 1.0 g/L to 8.0 g/L

A strong oxidation power of persulfuric acid (collective term of peroxomonosulfuric acid and peroxodisulfuric acid) inhibits silicon oxide from being etched by phosphoric acid. A persulfuric acid salt conventionally proposed is lower in degree of dissociation than persulfuric acid, and requires an increase in the amount thereof to be added. In accordance with this, a precipitate derived from a counter ion can be attached to a substrate. Accordingly, persulfuric acid is required not to be persulfuric acid derived from the salt, but to be persulfuric acid produced by electrolysis of sulfuric acid or mainly the persulfuric acid.

In the present invention, the concentration of persulfuric acid is not limited to a particular range, and the concentration of persulfuric acid desirably ranges from 1.0 to 8.0 g/L in the entire cleaning liquid. Such a range set can result in a further increase in selection ratio. If the concentration is less than 1.0 g/L, the function of suppressing etching of silicon oxide by phosphoric acid is not sufficient, and even if the concentration is more than 8.0 g/L, the function of suppressing the etching of silicon oxide is not further significantly improved. Herein, it is more desirable for the same reason that the lower limit be set to 2.0 g/L and the upper limit be set to 6.0 g/L.

In addition, in order to aid the persulfuric acid produced by electrolysis of sulfuric acid, persulfuric acid produced by mixing of sulfuric acid and hydrogen peroxide or mixing of sulfuric acid and ozone can be added for supplement.

Temperature of Cleaning Liquid: 165° C. or Higher and Lower than Boiling Point

In order that the cleaning liquid sufficiently achieves the function of etching silicon nitride, the cleaning liquid desirably has a temperature of 165° C. or higher and lower than the boiling point in cleaning.

If the temperature of the cleaning liquid is low, the function of etching silicon nitride by phosphoric acid is not sufficiently achieved. Herein, even when the cleaning liquid has a temperature of 165° C. or higher, etching of silicon oxide is not promoted and rather the suppression function thereof increases to provide a high selection ratio because the cleaning liquid includes the persulfuric acid produced by electrolysis of sulfuric acid and sulfuric acid. If not properly containing the persulfuric acid produced by electrolysis of sulfuric acid and sulfuric acid, the cleaning liquid is warmed to thereby accelerate etching of silicon oxide, not providing a high selection ratio.

The temperature of the cleaning liquid is more desirably 170° C. or higher from the above viewpoint, and is further desirably 175° C. or higher for the same reason.

In addition, the temperature of the cleaning liquid is desirably lower than the boiling point in terms of handleability.

Concentration of Phosphoric Acid: 15 to 40% by Mass
Concentration of Sulfuric Acid: 30 to 85% by Mass The concentration of phosphoric acid and the concentration of sulfuric acid are balanced to thereby keep etchability of silicon nitride high and suppress etching of silicon oxide, thereby imparting a high selection ratio while the cleaning effect is maintained.

Here, if the concentration of phosphoric acid is less than 15% by mass, the etching rate of SiN decreases to result in a reduction in practicality. On the other hand, if the concentration of phosphoric acid is more than 40% by mass, the etching rate of $SiO_2$ increases to result in a reduction in selection ratio $SiN/SiO_2$. Accordingly, the concentration of phosphoric acid is desirably 15 to 40% by mass. Herein, it is more desirable for the same reason that the lower limit of the concentration of phosphoric acid be 24% by mass and the upper limit thereof be 40% by mass.

In addition, if the concentration of sulfuric acid is less than 30% by mass, suppression of etching is insufficient and the etching rate of $SIC_2$ is high, resulting in a reduction in practicality. On the other hand, if the concentration of sulfuric acid is more than 85% by mass, the etching rate of SiN decreases to result in a reduction in practicality. Accordingly, the concentration of sulfuric acid is desirably 30 to 85% by mass. Herein, it is more desirable for the same reason that the lower limit of the concentration of sulfuric acid be 50% by mass and the upper limit thereof be 70% by mass.

Herein, the concentration of phosphoric acid and the concentration of sulfuric acid are each expressed as the concentration in the entire cleaning liquid.

Concentration Ratio of Phosphoric Acid to Sulfuric Acid: 1:1.5 to 1:4 (Concentration Ratio (% by Mass))

The concentration (% by mass) of phosphoric acid and the concentration (% by mass) of sulfuric acid in a mixed liquid in which phosphoric acid and sulfuric acid are mixed are balanced in a proper ratio to thereby impart a high selection ratio while the cleaning effect is maintained.

If the concentration ratio is less than 1:1.5, namely, the concentration of sulfuric acid is relatively lower, suppression of etching is insufficient and the etching rate of $SiO_2$ is high, resulting in a reduction in practicality. On the other hand, if the concentration ratio is more than 1:4, the function of phosphoric acid is so suppressed to decrease the etching rate of SiN, resulting in a reduction in practicality. Accordingly, the concentration ratio of phosphoric acid to sulfuric acid is desirably 1:1.5 to 1:4. Furthermore, it is more desirable that the lower limit of the concentration ratio of phosphoric acid to sulfuric acid be set to 1:2 and the upper limit thereof be set to 1:3.

In addition, the concentration ratio of phosphoric acid to sulfuric acid particularly desirably satisfies the above range at the concentration of phosphoric acid and the concentration of sulfuric acid in the proper ranges.

Water Content: 15 to 25% by Mass

If the water content in the cleaning liquid is less than 15% by mass, the hydrogen ion concentration decreases to thereby decrease the etching rate of SiN based on the following reaction scheme. In addition, if the water content is more than 25% by mass, the boiling point is too decreased to enable a high-temperature treatment to be performed, resulting in a decrease in the etching rate of SiN. Therefore, the water content desirably ranges from 15 to 25% by mass. Herein, it is more desirable for the same reason that the lower limit be set to 18% by mass and the upper limit be set to 22% by mass.

$$SiN_3N_4 + 12H_2O + 4H^+ \rightarrow 3Si(OH)_4 + 4NH_4^+ <-> 6H_2O + 3SiO_2 + 4NH_4^+$$

In the present invention, an object to be cleaned is a substrate having silicon nitride and silicon oxide on the same substrate, at least a portion of the silicon nitride and the silicon oxide being exposed on the substrate. The type and the like of the substrate are not particularly limited in the present invention, and the form where the silicon nitride and the silicon oxide are present is also not limited to a particular form. With respect to the silicon nitride and the silicon oxide, the silicon nitride can be stacked on the silicon oxide. In such a case, etching of the silicon oxide is problematic and suppression of the etching of the silicon oxide is required from the point when the silicon nitride is previously etched and the silicon oxide is exposed from the silicon nitride.

Herein, in the present invention, a particularly suitable object to be cleaned is a semiconductor substrate high in degree of integration having a pattern line width to be formed or formed on the substrate of 32 nm or less. When such a substrate having a fine line width is cleaned by a conventional cleaning liquid, a portion corresponding to the fine line width is easily damaged if the cleaning effect is to be sufficiently achieved. On the other hand, the cleaning liquid and the cleaning method of the present invention suppress etching of the silicon oxide to the minimum without damaging the portion corresponding to the fine line width, thereby making effective cleaning possible.

In the present invention, however, the pattern line width of the substrate to be cleaned is not limited to a particular one.

Moreover, while a cleaning method using the cleaning liquid of the present invention can conduct cleaning in a batch-type manner in which substrates are immersed in the cleaning liquid, the method is suitable for cleaning in a sheet-type manner in which the cleaning liquid is sprayed, dropped, flowed down, and the like on one substrate to allow the cleaning liquid to be brought into contact with the substrate. The batch-type cleaning has a problem of reattachment of particles, and the sheet-type cleaning is more suitable for removing a metal residue.

Advantageous Effects of Invention

As described above, the present invention can allow silicon nitride to be effectively etched while etching of silicon oxide is suppressed to result in a further increase in selection ratio, and can also allow effective cleaning to be performed without causing any contamination due to a cleaning liquid component. In particular, the present invention can allow cleaning to be performed even on a substrate having a fine pattern line width without any trouble.

DESCRIPTION OF EMBODIMENTS

Embodiment 1

Hereinafter, one embodiment of the present invention is described.

Since an apparatus (cleaning machine) that conducts cleaning is generally used for a portion that conducts an etching reaction, the portion that conducts an etching reaction is also designated as a cleaning machine in the description of the present embodiment.

Figure 1:
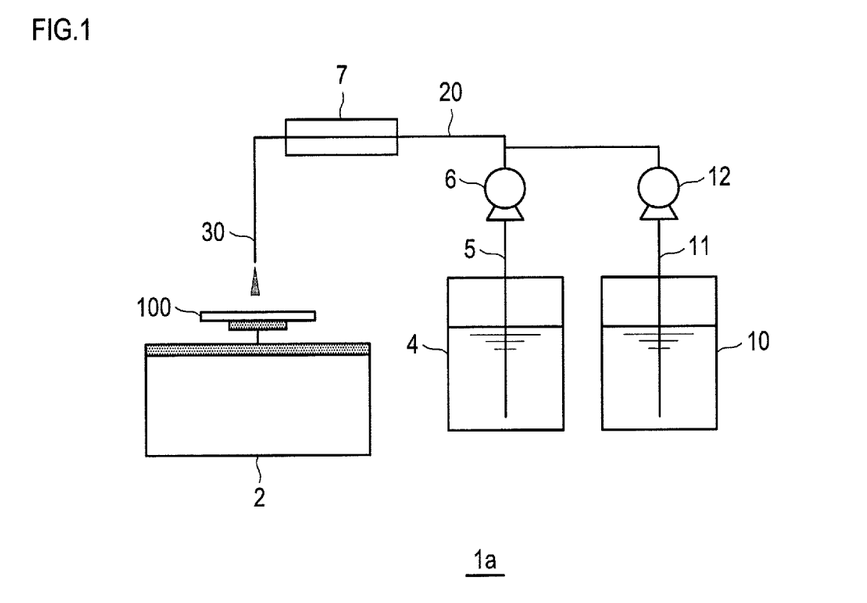
FIG. 1 is a view illustrating a substrate cleaning system for use in one embodiment of the present invention.

A semiconductor substrate cleaning system 1a having the cleaning machine is described below based on FIG. 1.

The semiconductor substrate cleaning system 1a includes a cleaning machine 2 corresponding to a cleaning portion, a first solution storage tank 4 that stores an electrolytic sulfuric acid solution including persulfuric acid produced by electrolysis of sulfuric acid, and a second solution storage tank 10 that stores a phosphoric acid solution. The electrolytic sulfuric acid solution including persulfuric acid corresponds to a first solution, and the phosphoric acid solution corresponds to a second solution.

The cleaning machine 2 can be either of a sheet-type cleaning machine or a batch-type cleaning machine, and is more desirably a sheet-type cleaning machine that can constantly conduct a treatment with a clean liquid.

The cleaning machine 2 includes a delivery portion 30 that delivers a solution for cleaning to a semiconductor substrate 100. The delivery portion 30 sprays, drops, or flows down the solution for cleaning to the semiconductor substrate 100, or, in the case of a batch-type cleaning machine, supplies the solution into a cleaning tank. Herein, such dropping and flowing down can be conducted by blowing the solution to the semiconductor substrate 100 by application of pressure.

A first solution transport path 5 that transports the solution in the first solution storage tank 4 is connected to the first solution storage tank 4. In addition, a second solution transport path 11 that transports the solution in the second solution storage tank 10 is connected to the second solution storage tank 10. The first solution transport path 5 is provided with a liquid-feeding pump 6, and the second solution transport path 11 is provided with a liquid-feeding pump 12. The first solution transport path 5 and the second solution transport path 11 are joined together at the downstream of the liquid-feeding pump 6 and the liquid-feeding pump 12 to form a common transport path 20 that transports a mixed solution in which the first solution and the second solution are mixed, and the downstream end of the common transport path 20 is connected to the delivery portion 30. Moreover, the common transport path 20 is provided with a heater 7 that heats the mixed solution to be fed.

The first solution storage tank 4 accommodates a sulfuric acid solution that is adjusted so that the concentration of persulfuric acid is a predetermined concentration of 1.0 to 8.0 g/L and the concentration of sulfuric acid is a predetermined concentration of 30 to 85% by mass in the mixed solution.

The electrolytic sulfuric acid solution as the first solution can be supplied to the first solution storage tank 4 in a batch-type manner and stored therein, or can be continuously supplemented with an electrolytic sulfuric acid solution including a required amount of persulfuric acid, depending on the amount thereof consumed. The electrolytic sulfuric acid solution can be effectively produced by electrolysis of sulfuric acid, and added for supplement.

On the other hand, in the second solution storage tank 10, the concentration of phosphoric acid in the mixed solution is adjusted so as to be a predetermined concentration of 15 to 40% by mass.

When the semiconductor substrate 100 is cleaned, the semiconductor substrate 100 is placed on and supported by a semiconductor support tool, and also the sulfuric acid solution including persulfuric acid in the first solution storage tank 4 is fed through the first solution transport path 5 at a predetermined flow rate by the liquid-feeding pump 6 and the phosphoric acid solution in the second solution storage tank 10 is fed through the second solution transport path 11 at a predetermined flow rate by the liquid-feeding pump 12. Both the solutions are mixed in the common transport path 20 where both the transport paths are joined together. Herein, the flow rate of the sulfuric acid solution and the flow rate of the phosphoric acid solution are set so that when both the solutions are mixed, a predetermined mixing ratio is achieved and the flow rate of the solutions mixed is a predetermined flow rate.

In the present embodiment, the mixed liquid of the electrolytic sulfuric acid solution including persulfuric acid with phosphoric acid is transiently heated by the heater 7 after these are joined together. The heating temperature is adjusted so that when the mixed liquid is brought into contact with the semiconductor substrate 100, the liquid temperature reaches a predetermined temperature of 165° C. or higher (lower than the boiling point). In the present embodiment, while the mixed liquid is heated in the common transport path 20, respective heaters can be provided on both of the first solution transport path 5 and the second solution transport path 11 to heat the respective solutions, or heating in each of the transport paths and heating in the common transport path can be used together. In both of the cases, the liquid temperature on the semiconductor 100 is desirably adjusted so as to be a predetermined temperature of 165° C. or higher (lower than the boiling point).

The sulfuric acid solution including persulfuric acid and the phosphoric acid solution are delivered from the delivery portion 30 in the state of a mixed solution where the concentration of persulfuric acid is 1.0 to 8.0 g/L, the concentration of phosphoric acid is 15 to 40% by mass, the concentration of sulfuric acid is 30 to 85% by mass, the water content is 15% by mass to 25% by mass, and the liquid temperature is 165° C. or higher (lower than the boiling point), to be brought into contact with the semiconductor substrate 100 for performing etching of the semiconductor substrate 100.

The concentrations of the sulfuric acid solution and the phosphoric acid solution, and the water content can be adjusted by mixing with water in the first solution storage tank 4 for providing each predetermined concentration, or by supplying the sulfuric acid solution adjusted to have a predetermined concentration to the first solution storage tank 4. In addition, as in the case of the sulfuric acid solution, the phosphoric acid solution can also be mixed with water in the second solution storage tank 10 or a phosphoric acid solution adjusted to have a predetermined concentration can also be supplied to the second solution storage tank 10.

The sulfuric acid solution including persulfuric acid and the phosphoric acid solution can be delivered from the delivery portion 30 in the state of being mixed or can be mixed on the semiconductor substrate 100, where the concentration of persulfuric acid is 1.0 to 8.0 g/L, the concentration of phosphoric acid is 15 to 40% by mass, the concentration of sulfuric acid is 30 to 85% by mass, the water content is 15% by mass to 25% by mass in the mixed solution, and the liquid temperature is 165° C. or higher (lower than the boiling point), and the adjustment methods of the solutions and the etching method are not limited to those described above.

Embodiment 2

Figure 2:
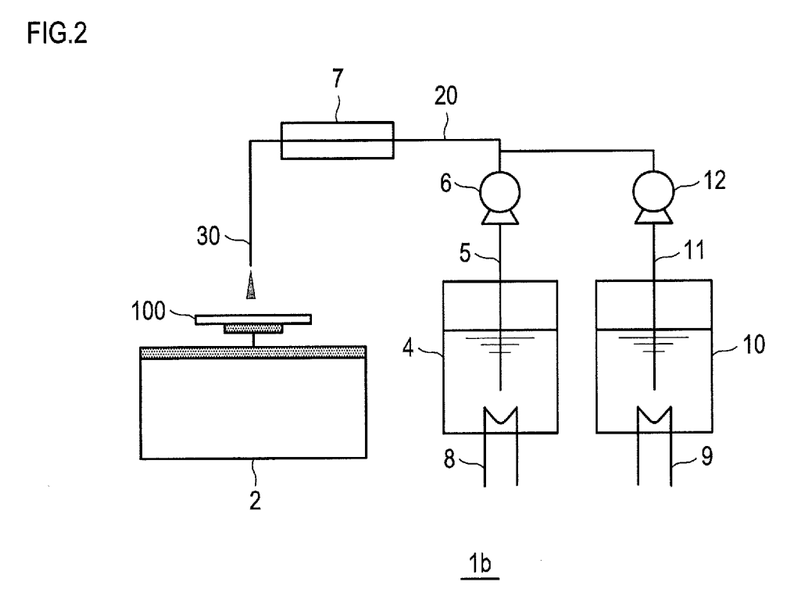
FIG. 2 is again a view illustrating another substrate cleaning system.

Next, a semiconductor substrate cleaning system 1*b* of Embodiment 2 is described based on FIG. 2. Herein, the same configurations as in Embodiment 1 are represented by the same reference numerals, and the description thereof is omitted or simplified.

The semiconductor substrate cleaning system 1*b* includes a sheet-type cleaning machine 2 corresponding to an etching portion, a first solution storage tank 4 that stores an electrolytic sulfuric acid solution including persulfuric acid produced by electrolysis, and a second solution storage tank 10 that stores a phosphoric acid solution.

The first solution storage tank is provided with a heater 8, and the second solution storage tank is provided with a heater 9. The temperature of the first solution storage tank 4 in which the electrolytic sulfuric acid solution including persulfuric acid is stored is desirably set to a temperature at which the reaction rate of self-decomposition of persulfuric acid is relatively low, for example, 50 to 100° C.

The first solution storage tank 4 accommodates a sulfuric acid solution that is adjusted so that the concentration of persulfuric acid is a predetermined concentration of 1.0 to 8.0 g/L and the concentration of sulfuric acid is a predetermined concentration of 30 to 98% by mass in the mixed solution obtained by mixing with the phosphoric acid solution, as in Embodiment 1. On the other hand, in the second solution storage tank 10, the concentration of phosphoric acid is adjusted so as to be 15 to 40% by mass in the mixed solution obtained by mixing with the electrolytic sulfuric acid solution including persulfuric acid, as in Embodiment 1.

The electrolytic sulfuric acid solution as the first solution can be supplied to the first solution storage tank 4 in a batch-type manner and stored therein, or can be continuously supplemented with an electrolytic sulfuric acid solution including a required amount of persulfuric acid, depending on the amount thereof consumed. The electrolytic sulfuric acid solution can be effectively produced by electrolysis of the sulfuric acid solution, and added for supplement.

In the present embodiment, a mixed liquid of the first solution (electrolytic sulfuric acid solution) and the second solution (phosphoric acid) is transiently heated by a heater 7 for temperature rise so that when the mixed liquid is brought into contact with a semiconductor substrate 100, the liquid temperature reaches a predetermined temperature of 165° C. or higher (lower than the boiling point). If the mixed liquid is here heated by the heaters 8 and 9, the load of heating by the heater 7 can be decreased. When the solution including persulfuric acid is heated in the storage tank, however, the temperature thereof is desirably suppressed to 100° C. or lower so that self-decomposition of persulfuric acid does not progress too much. When the semiconductor substrate 100 is etched, the semiconductor substrate 100 is supported by a semiconductor support tool and the sulfuric acid solution including persulfuric acid in the first solution storage tank 4 is fed through a first solution transport path 5 at a predetermined flow rate by a liquid-feeding pump 6 and the phosphoric acid solution in the second solution storage tank 10 is fed through a second solution transport path 11 at a predetermined flow rate by a liquid-feeding pump 12. Both the solutions are mixed in a common transport path 20 where both the transport paths are joined together. Herein, the flow rate of the sulfuric acid solution and the flow rate of the phosphoric acid solution are set so that when both the solutions are mixed, a predetermined concentration ratio is achieved and the flow rate of the solutions mixed is a predetermined flow rate.

The sulfuric acid solution including persulfuric acid is heated by the heater 8 in the first solution storage tank 4 and the phosphoric acid solution is heated by the heater 9 in the second solution storage tank 10, and when these solutions are brought into to contact with the semiconductor substrate 100, the liquid temperature is adjusted so as to be a predetermined temperature of 165° C. or higher (lower than the boiling point).

The mixed solution of the electrolytic sulfuric acid solution and the phosphoric acid solution, in the state where the concentration of persulfuric acid is 1.0 to 8.0 g/L, the concentration of phosphoric acid is 15 to 40% by mass, the concentration of sulfuric acid is 30 to 85% by mass, the water content is 15% by mass to 25% by mass, and the liquid temperature is 165° C. or higher (lower than the boiling point), is delivered from a delivery portion 30 to be brought into contact with the semiconductor substrate 100 for performing etching of the semiconductor substrate 100.

Embodiment 3

Figure 3:
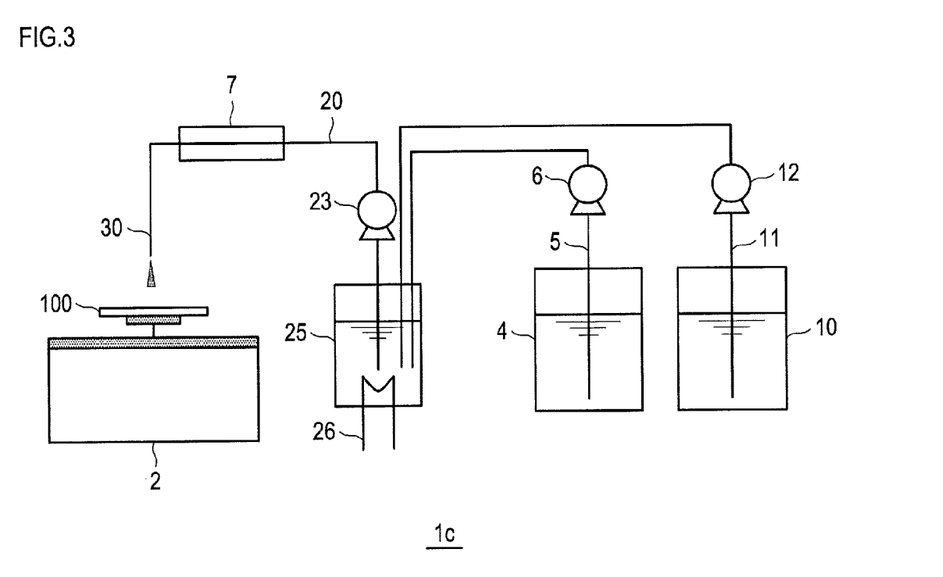
FIG. 3 is again a view illustrating still another substrate cleaning system.

Next, a semiconductor substrate cleaning system is of Embodiment 3 is described based on FIG. 3. Herein, the same configurations as in Embodiment 1 are represented by the same reference numerals, and the description thereof is omitted or simplified.

In this Embodiment, a first solution transport path 5 connected to a first solution storage tank 4 and a second solution transport path 11 connected to a second solution storage tank 10 are connected to a mixing tank 25, and a common transport path 20 connected to the mixing tank 25 is connected to a delivery portion 30. The mixing tank 25 is provided with a mixing tank heater 26, and the common transport path 20 is provided with a heater 7.

In this Embodiment, in order that phosphoric acid and sulfuric acid in the mixed liquid of the first solution (electrolytic sulfuric acid solution) and the second solution (phosphoric acid solution) are stored in the mixing tank 25 in a predetermined concentration ratio, the first solution (electrolytic sulfuric acid solution) is transported from the first solution storage tank 4 through the first solution transport path 5 to the mixing tank 25 by a liquid-feeding pump 6, and the second solution (phosphoric acid solution) is transported from the second solution storage tank 10 through the second solution transport path 11 to the mixing tank 25 by a liquid-feeding pump 12.

The solution in the mixing tank 25 is adjusted so that the concentration of persulfuric acid is a predetermined concentration of 1.0 to 8.0 g/L, the concentration of sulfuric acid is a predetermined concentration of 30 to 85% by mass, the concentration of phosphoric acid is a predetermined concentration of 15 to 40% by mass, and the water content is 15% by mass to 25% by mass.

The electrolytic sulfuric acid solution as the first solution can be supplied to the first solution storage tank 4 in a batch-type manner and stored therein, or can be continuously supplemented with an electrolytic sulfuric acid solution including a required amount of persulfuric acid, depending on the amount thereof consumed. The electrolytic sulfuric acid solution can be effectively produced by electrolysis of the sulfuric acid solution, and added for supplement.

The mixed solution stored in the mixing tank 25 is if necessary heated by the mixing tank heater 26, and transported through the common transport path 20 by a liquid-feeding pump 23. The mixed solution is here transiently heated by the heater 7 for temperature rise so that when the mixed solution is brought into contact with a semiconductor substrate 100, the liquid temperature reaches a predetermined temperature of 165° C. or higher (lower than the boiling point). If the mixed solution is here heated by the heater 26, the load of heating by the heater 7 can be decreased. When the mixed solution including persulfuric acid is heated in the mixing tank 25, however, the temperature thereof is desirably suppressed to 100° C. or lower so that self-decomposition of persulfuric acid does not progress too much. The mixed solution is brought into contact with the semiconductor substrate 100 to thereby perform etching of the semiconductor substrate 100.

Embodiment 4

Figure 4:
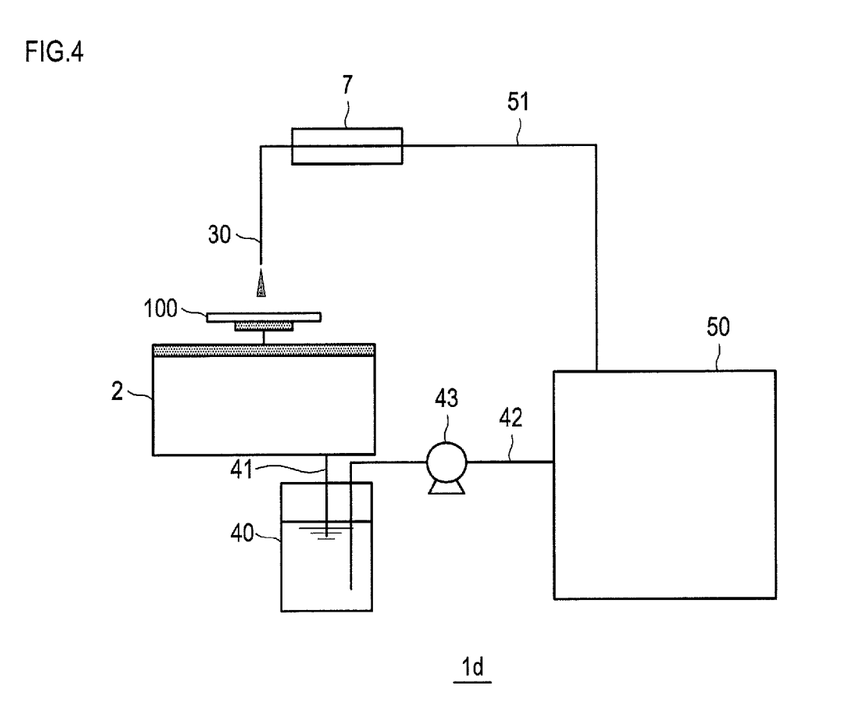
FIG. 4 is again a view illustrating still another substrate cleaning system.

A semiconductor substrate cleaning system 1d of Embodiment 4 is described based on FIG. 4. Herein, the same configurations as in Embodiment 1 are represented by the same reference numerals, and the description thereof is omitted or simplified.

In this Embodiment, the semiconductor substrate cleaning system 1d includes a cleaning machine 2 corresponding to the etching portion, and a recovered liquid storage tank 40 for recovering, circulating, and reusing the mixed liquid of the electrolytic sulfuric acid solution and the phosphoric acid solution which is used for etching and exits from the cleaning machine 2. A transport path 41 is connected between the cleaning machine 2 and the recovered liquid storage tank 40, and furthermore a transport path 42 is connected to the recovered liquid storage tank 40 and the transport path 42 is provided with a liquid-feeding pump 43. An electrolysis apparatus 50 is connected to the end of the transport path 42 at the downstream of the liquid-feeding pump 43. The draining portion of the electrolysis apparatus 50 is connected to the cleaning machine 2 by a transport path 51, and the downstream end of the transport path 51 is connected to a delivery portion 30. In addition, the transport path 51 is provided with a heater 7 that heats the mixed solution fed.

The mixed liquid collected in the recovered liquid storage tank 40 is fed through the transport path 42 to the electrolysis apparatus 50 by the liquid-feeding pump 43. In the electrolysis apparatus 50, the mixed solution recovered is electrolyzed under a predetermined condition to provide a mixed liquid of phosphoric acid/sulfuric acid, including perphosphoric acid and persulfuric acid adjusted at predetermined concentrations, set at a predetermined concentration and a predetermined temperature, and the mixed liquid is transiently heated by the heater 7 through the transport path 51. The heating temperature is adjusted so that when the mixed liquid is brought into contact with a semiconductor substrate 100, the liquid temperature reaches a predetermined temperature of 165° C. or higher (lower than the boiling point). The mixed liquid is adjusted so that the concentration of phosphoric acid is a predetermined concentration of 15 to 40% by mass, the concentration of sulfuric acid is a predetermined concentration of 30 to 85% by mass, and the water content is 15% by mass to 25% by mass. In the electrolysis apparatus 50, electrolysis conditions are adjusted so that the concentration of persulfuric acid in the mixed liquid is a predetermined concentration of 1.0 to 8.0 g/L. The mixed liquid including the electrolytic sulfuric acid is heated to a predetermined temperature, delivered from the delivery portion 30, to be brought into contact with the semiconductor substrate 100 for performing etching of the semiconductor substrate 100.

thereby prepare a mixed liquid in which the ratio of phosphoric acid to sulfuric acid was 1:2 (concentration ratio (% by weight)) and the concentration of persulfuric acid was 5 g/L with the moisture concentration being adjusted to a predetermined value. Herein, the concentration of persulfuric acid in the mixed liquid was measured as follows: the concentration of an oxidative substance was measured by the iodine titration method, the concentration of hydrogen peroxide was analyzed by the potassium permanganate titration method, and the difference therebetween was calculated as the concentration of persulfuric acid.

The mixed liquid was heated to 180° C. and dropped on a silicon substrate, on which SiN was exposed, for 3 minutes, and the resultant was subjected to a SiN etching test. The test conditions are shown in Table 1.

Herein, the etching rate of silicon nitride was determined by dividing the reduction in film thickness of a silicon substrate with a silicon nitride film thereon, which was the difference between the thicknesses before and after an etching treatment determined using an ellipsometer manufactured by Mizojiri Optical Co., Ltd., by the etching time. In addition, the selection ratio of etching of silicon nitride to silicon oxide was determined by dividing the etching rate of silicon nitride by the etching rate of silicon oxide determined in the same manner as in that of silicon nitride. The results are shown in Table 1.

TABLE 1

| | Concentration of phosphoric acid | Concentration of sulfuric acid | Phosphoric acid:Sulfuric acid | Moisture concentration | Concentration of persulfuric acid | Temperature of the cleaning liquid | Etching rate of SiN (A/min) | Selection ratio |
|---|---|---|---|---|---|---|---|---|
| Comparative Example 1 | 86 wt % | 86 wt % | 1:2 | 14 wt % | 5 g/L | 180° C. | 78 | 148 |
| Experimental Example 1 | 85 wt % | 85 wt % | 1:2 | 15 wt % | 5 g/L | 180° C. | 90 | 192 |
| Experimental Example 2 | 82 wt % | 82 wt % | 1:2 | 18 wt % | 5 g/L | 180° C. | 87 | 210 |
| Experimental Example 3 | 78 wt % | 78 wt % | 1:2 | 22 wt % | 5 g/L | 180° C. | 79 | 237 |
| Experimental Example 4 | 75 wt % | 75 wt % | 1:2 | 25 wt % | 5 g/L | 180° C. | 78 | 229 |
| Comparative Example 2 | 72 wt % | 72 wt % | 1:2 | 28 wt % | 5 g/L | 160° C. | 25 | 98 |

The present apparatus is more preferable because the mixed liquid used for etching can be recovered and persulfuric acid decreased by reaction and self-decomposition can be re-produced by electrolysis of the mixed solution to be supplied, and therefore the amount of a chemical liquid to be used can be reduced and the amount of a liquid to be wasted can also be reduced.

EXAMPLES

Experimental Example 1

Sulfuric acid at a predetermined concentration is electrolyzed to produce electrolytic sulfuric acid.

Mixed were 500 mL of phosphoric acid having a predetermined concentration and 1000 mL of electrolytic sulfuric acid including sulfuric acid whose concentration was the same as the concentration (% by mass) of phosphoric acid to It has been revealed from Table 1 that the moisture concentration (water content) is suitably 15 to 25% by mass, more suitably 18 to 22% by mass from the viewpoints of favorable etching and a high selection ratio of silicon nitride.

Experimental Example 2

The SiN etching test was performed under the same conditions as in Example 1 except that the electrolysis conditions of sulfuric acid were varied so that the concentration of persulfuric acid in the mixed liquid was a predetermined concentration. When the concentration of persulfuric acid was 0, however, such electrolysis was not performed.

The mixed liquid was heated to 180° C. and dropped on a silicon substrate, on which SiO$_2$ was exposed, for 15 minutes, and a SiO$_2$ etching test was performed. The etching rate and the selection ratio of each case were calculated in the same manner as in Experimental Example 1.

The test conditions and the test results are shown in

TABLE 2

|  | Concentration of phosphoric acid | Concentration of sulfuric acid | Phosphoric acid:Sulfuric acid | Moisture concentration | Concentration of persulfuric acid | Temperature of the cleaning liquid | Etching rate of SiN (A/min) | Selection ratio |
|---|---|---|---|---|---|---|---|---|
| Comparative Example 3 | 85 wt % | 85 wt % | 1:2 | 15 wt % | 0 g/L | 180° C. | 78 | 150 |
| Experimental Example 5 | 85 wt % | 85 wt % | 1:2 | 15 wt % | 1 g/L | 180° C. | 80 | 177 |
| Experimental Example 6 | 85 wt % | 85 wt % | 1:2 | 15 wt % | 2 g/L | 180° C. | 97 | 200 |
| Experimental Example 7 | 85 wt % | 85 wt % | 1:2 | 15 wt % | 4 g/L | 180° C. | 88 | 222 |
| Experimental Example 8 | 85 wt % | 85 wt % | 1:2 | 15 wt % | 6 g/L | 180° C. | 77 | 250 |
| Experimental Example 9 | 85 wt % | 85 wt % | 1:2 | 15 wt % | 8 g/L | 180° C. | 97 | 252 |

Under the present conditions, even when the concentration of persulfuric acid in the mixed liquid was 1.0 g/L, the selection ratio was 170 or more, when the concentration was 2.0 g/L or more, the selection ratio was 200 or more, furthermore, when the concentration of persulfuric acid was 6.0 g/L or more, the selection ratio was about 250, and even when the concentration of persulfuric acid was further increased, the selection ratio was about 250.

Figure 5:
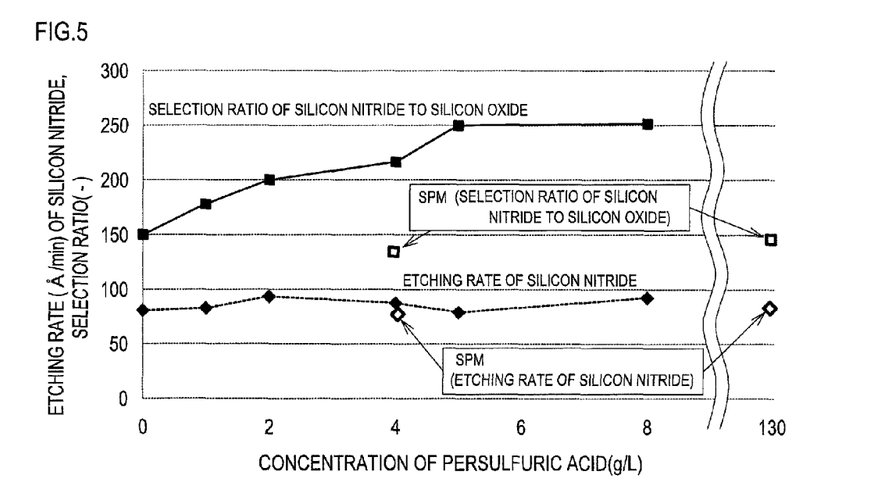
FIG. 5 is a graph showing the etching rate and the selection ratio according to the concentration of persulfuric acid in Examples of the present invention.
Figure 6:
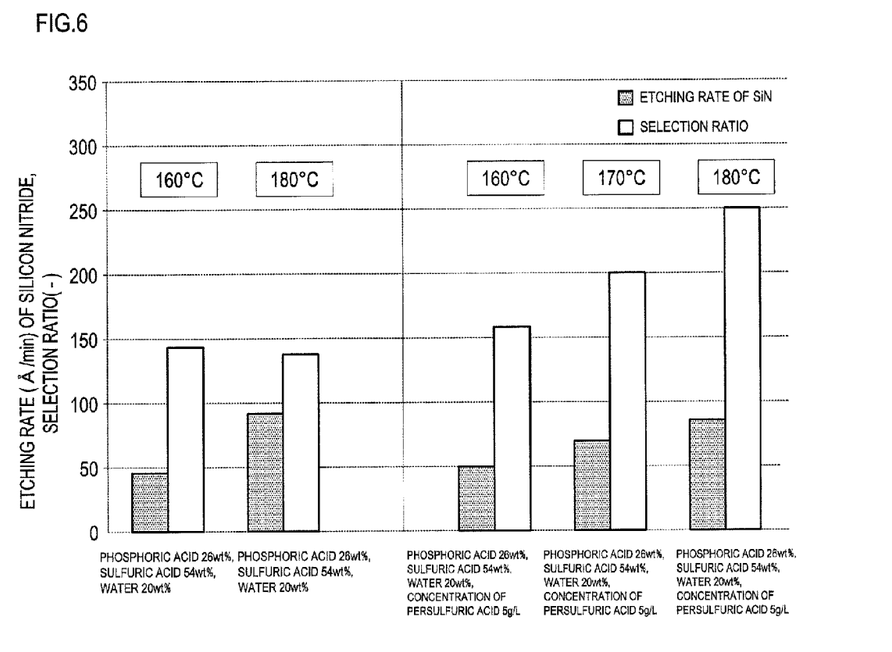
FIG. 6 is again a graph showing the etching rate and the selection ratio of silicon nitride according to the presence of persulfuric acid, the water content, and the difference in warming temperature.

On the other hand, the test in the case of addition of hydrogen peroxide to sulfuric acid under assumption of SPM was also performed for comparative data, and the results are shown in the graph of FIG. 5 together with the results in Table 2. The results of the test simulating SPM (sulfuric acid/hydrogen peroxide water) did not reach a selection ratio of even 150 under all the conditions.

The mixed liquid was heated at a predetermined temperature and dropped on a silicon substrate, on which SiO$_2$ was exposed, for 15 minutes to perform the SiO$_2$ etching test. The etching rate and the selection ratio of each case were calculated in the same manner as in Experimental Example 1. The test conditions and the test results are shown in Table 3.

In the case of the mixed liquid not containing persulfuric acid, an increase in the warming temperature not only enhances the function of etching silicon nitride, but also promotes the etching of silicon oxide, and inversely reduces the selection ratio.

On the other hand, in the case of the mixed liquid containing persulfuric acid, an increase in the temperature of the mixed liquid enhances the function of etching silicon nitride, but etching of silicon oxide is suppressed and therefore the selection ratio is significantly enhanced.

TABLE 3

|  | Concentration of phosphoric acid | Concentration of sulfuric acid | Phosphoric acid:Sulfuric acid | Moisture concentration | Concentration of persulfuric acid | Temperature of the cleaning liquid | Etching rate of SiN (A/min) | Selection ratio |
|---|---|---|---|---|---|---|---|---|
| Comparative Example 4 | 80 wt % | 80 wt % | 1:2 | 20 wt % | 0 g/L | 160° C. | 42 | 148 |
| Comparative Example 5 | 80 wt % | 80 wt % | 1:2 | 20 wt % | 0 g/L | 180° C. | 93 | 140 |
| Comparative Example 6 | 80 wt % | 80 wt % | 1:2 | 20 wt % | 5 g/L | 160° C. | 50 | 157 |
| Experimental Example 10 | 80 wt % | 80 wt % | 1:2 | 20 wt % | 5 g/L | 165° C. | 56 | 180 |
| Experimental Example 11 | 80 wt % | 80 wt % | 1:2 | 20 wt % | 5 g/L | 170° C. | 72 | 200 |
| Experimental Example 12 | 80 wt % | 80 wt % | 1:2 | 20 wt % | 5 g/L | 180° C. | 85 | 250 |

Table 2

Experimental Example 3

The SiN etching test was performed under the same conditions as in each of Comparative Example 3 and Example 1 except that the concentration of phosphoric acid, the concentration of sulfuric acid, the moisture concentration, and the liquid temperature were changed in each of the cases of the mixed liquid not including persulfuric acid and the mixed liquid including persulfuric acid (5 g/L).

Experimental Example 4

The SiN etching test was performed under the same conditions as in Example 1 except that the concentration ratio of phosphoric acid and sulfuric acid in the mixed liquid after mixing was varied.

The mixed liquid was heated to 180° C. and dropped on a silicon substrate, on which SiO$_2$ was exposed, for 15 minutes, to perform the SiO$_2$ etching test. The etching rate and the selection ratio of each case were calculated in the same manner as in Experimental Example 1. The test conditions and the test results are shown in Table 4.

TABLE 4

|  | Concentration of phosphoric acid | Concentration of sulfuric acid | Phosphoric acid:Sulfuric acid | Moisture concentration | Concentration of persulfuric acid | Temperature of the cleaning liquid | Etching rate of SiN (A/min) | Selection ratio |
|---|---|---|---|---|---|---|---|---|
| Comparative Example 7 | 85 wt % | 85 wt % | 2:1 | 15 wt % | 5 g/L | 180° C. | 118 | 58 |
| Comparative Example 8 | 85 wt % | 85 wt % | 1:1 | 15 wt % | 5 g/L | 180° C. | 107 | 155 |
| Experimental Example 13 | 85 wt % | 85 wt % | 1:1.5 | 15 wt % | 5 g/L | 180° C. | 95 | 170 |
| Experimental Example 1 | 85 wt % | 85 wt % | 1:2 | 15 wt % | 5 g/L | 180° C. | 90 | 192 |
| Experimental Example 14 | 85 wt % | 85 wt % | 1:3 | 15 wt % | 5 g/L | 180° C. | 62 | 201 |
| Experimental Example 15 | 85 wt % | 85 wt % | 1:4 | 15 wt % | 5 g/L | 180° C. | 38 | 215 |
| Comparative Example 9 | 85 wt % | 85 wt % | 1:5 | 15 wt % | 5 g/L | 180° C. | 30 | 218 |

Under the present conditions, when the concentration (% by mass) of sulfuric acid is 1.5 times or more the concentration (% by mass) of phosphoric acid, the selection ratio is 170 or more. On the other hand, when the ratio of the concentration (% by mass) of phosphoric acid to the concentration (% by mass) of sulfuric acid is 1:5, the etching rate of SiN is reduced while the selection ratio is high. Accordingly, it has been confirmed that the concentration ratio of phosphoric acid to sulfuric acid is preferably 1:1.5 to 1:4, and is more preferably 1:2 to 1:3 for the same reason.

As described above, it has been indicated according to the present invention that the following results can be obtained: the etching rate of SiN is 35 or more (preferably 60 or more) and the selection ratio is 170 or more (preferably 190 or more).

Hereinabove, the present invention is described based on the above, but the present invention is not limited to the descriptions of Embodiments and Examples above, and can be appropriately modified without departing the scope of the present invention.

REFERENCE SIGNS LIST 1a, 1b, 1c, 1d: semiconductor substrate cleaning system
2: cleaning machine
4: first solution storage tank
5: first solution transport path
6: liquid-feeding pump
8: heater
9: heater
10: second solution storage tank
11: second solution transport path
12: liquid-feeding pump
20: common transport path
23: liquid-feeding pump
25: mixing tank
26: heater
30: delivery portion
40: recovered liquid storage tank
41: transport path
42: transport path
43: liquid-feeding pump
51: transport path
100: semiconductor substrate

The invention claimed is:

1. A substrate cleaning liquid that is a cleaning liquid for use in cleaning of a substrate having silicon nitride and silicon oxide on the same substrate, at least a portion of one or both of the silicon nitride and the silicon oxide being exposed on the substrate, wherein the cleaning liquid comprises phosphoric acid, electrolytic sulfuric acid including persulfuric acid produced by electrolysis of sulfuric acid, and water, and is warmed to 165° C. or higher and lower than a boiling point for use in the cleaning, wherein a concentration of the persulfuric acid produced by electrolysis in an entire cleaning liquid is 1.0 to 8.0 g/L.

2. The substrate cleaning liquid according to claim 1, wherein a concentration of the phosphoric acid is 15 to 40% by mass and a concentration of the sulfuric acid is 30 to 85% by mass in the entire cleaning liquid.

3. The substrate cleaning liquid according to claim 1, wherein a ratio of a concentration (% by mass) of the phosphoric acid to a concentration (% by mass) of the sulfuric acid ranges from 1:1.5 to 1:4 in the entire cleaning liquid.

4. The substrate cleaning liquid according to claim 1, having a water content of 15 to 25% by mass.

5. The substrate cleaning liquid according to claim 1, for use in sheet-type cleaning of the substrate.

6. A substrate cleaning method that is a method for cleaning a substrate having silicon nitride and silicon oxide on the same substrate, at least a portion of one or both of the silicon nitride and the silicon oxide being exposed on the substrate, the method comprising bringing the substrate into contact with a substrate cleaning liquid according to claim 1 to selectively etch the silicon nitride on the substrate.

7. The substrate cleaning method according to claim 6, wherein the silicon nitride is stacked on the silicon oxide on the substrate.

8. The substrate cleaning method according to claim 6, wherein the substrate has a pattern line width of 32 nm or less.

9. The substrate cleaning method according to claim 6, comprising cleaning the substrate by the cleaning liquid in a sheet-type manner.

10. The substrate cleaning method according to claim 6, comprising recovering a cleaning liquid used for cleaning, subjecting the cleaning liquid to electrolysis to increase a concentration of persulfuric acid, and thereafter further subjecting the resulting cleaning liquid to the cleaning as a cleaning liquid.

* * * * *